United States Patent [19]
Yin

[11] Patent Number: 5,684,674
[45] Date of Patent: Nov. 4, 1997

[54] CIRCUIT BOARD MOUNTING BRACKETS WITH CONVECTIVE AIR FLOW APERTURES

[75] Inventor: Jim Yin, Fremont, Calif.

[73] Assignee: Micronics Computers Inc., Fremont, Calif.

[21] Appl. No.: 584,321

[22] Filed: Jan. 16, 1996

[51] Int. Cl.[6] .................................................. H05K 7/20
[52] U.S. Cl. ........................... 361/695; 361/352; 361/825; 248/309.1
[58] Field of Search ........................... 361/683, 686–687, 361/690, 692–695, 736, 752–753, 807, 809, 825, 831; 248/214, 309.1, 225.11, 223.41

[56] References Cited

U.S. PATENT DOCUMENTS

| | | | |
|---|---|---|---|
| 4,716,499 | 12/1987 | Bhargava | 361/686 |
| 4,745,524 | 5/1988 | Patton, III | 361/753 |
| 4,791,524 | 12/1988 | Teigen et al. | 361/752 |
| 4,827,375 | 5/1989 | Segal | 361/831 |
| 4,924,355 | 5/1990 | Mitchell et al. | 361/825 |
| 5,564,930 | 10/1996 | Yu | 361/686 |

*Primary Examiner*—Gregory D. Thompson
*Attorney, Agent, or Firm*—Paul Hentzel

[57] ABSTRACT

Computer apparatus 10 has a convective air flow therethrough for removing heat generated by the IC chips on circuit boards 12H, 12M, and 12L and by other computer components within housing 10H. The housing confines the convective air flow, and has elongated I/O openings 10E therethrough for accommodating I/O connections to the circuit boards. The circuit boards are mounted within the housing in an adjacent parallel relationship forming air flow channels therebetween. Each circuit board has a housing end 12P proximate the I/O openings in the housing and an interior end 12D distant from the housing. A mounting bracket 14 is fastened to each circuit board at the housing end and is secured to the housing to cover the I/O openings. Air vent apertures 16 in the mounting brackets provide air flow communication through the mounting brackets and the I/O openings for directing a portion of the convective air flow through the channel over the adjacent circuit boards. Fan 10F pushes the air flow out of the housing causing cool outside air to be drawn into the housing through each aperture 16.

29 Claims, 3 Drawing Sheets

CIRCUIT BOARD MOUNTING BRACKETS WITH CONVECTIVE AIR FLOW APERTURES

TECHNICAL FIELD

This invention relates to mounting brackets for securing circuit boards to the housing of a computer apparatus, and more particularly to such mounting brackets with air vent apertures therein for permitting the flow of cooling air over the circuit boards.

BACKGROUND

Heretofore computers were cooled by an intake fan mounted in the housing. The fan pulled cool air into the housing for circulation and pushed the warmed air out through exhaust air vents. The primary convective air flow was along a main path across the housing from the fan to the exhaust vents. Corner regions within the housing and other out-of-the-way places off the main path received less convective air flow. Narrow air channels between closely mounted circuit boards were particularly difficult to cool. These channels presented a dead-end structure to the convective air flow. The channels were closed on each side by the circuit boards, closed on the bottom by the mother board, and closed at one end by the housing. Only the interior end of the channel was open to the main flow path. The tops of the channels sometimes had a small air gap. More often the circuit boards were flush with the housing cover precluding such a top air gap. The minimal convective exposure of the channels resulted in a pocket of still air in each channel, especially along the bottom of the channel at the housing end. Heat generated by the components on these circuit boards was transferred to the air in the adjacent channel by conduction. However, this heat was not removed effectively from the channel by the convective air flow. The operating temperatures of these undercooled components increased creating a uneven temperature distribution within the housing, possibly resulting in thermal failure.

SUMMARY

It is therefore an object of this invention to provide a computer apparatus with an improved convective air flow to create a more even temperature distribution within the computer housing.

It is another object of this invention to provide mounting brackets for circuit boards in such a computer apparatus which permit cooling air to flow through the channels formed between adjacent circuit boards.

It is a further object of this invention to provide such a computer apparatus with a convective air flow system in which the volume of air flow in each channel may be altered.

It is a further object of this invention to provide such a convective air flow system in which the volume of air flow in each channel may be altered by aperture plugs.

It is a further object of this invention to provide such a convective air flow system in which the volume of air flow in each channel is determined by the size of the air vent apertures.

It is a further object of this invention to provide such a convective air flow system in which the volume of air flow in each channel is determined by the number of air vent apertures.

Briefly, these and other objects of the present invention are accomplished by providing a computer apparatus with a convective cooling air flow between the circuit boards therein. A housing confines the convective air flow, and has elongated I/O openings therethrough. A fan device moves the air flow into and out of the housing, circulating the convective air flow throughout the housing. Mounting brackets positioned over the I/O openings secures the circiut boards to the housing. Air vent apertures in the mounting brackets provide air flow communication through the mounting brackets and the I/O openings for directing a portion of the cooling air flow over each of the circuit boards.

BRIEF DESCRIPTION OF THE DRAWING

Further objects and advantages of the present convective air flow system and the operation of air vent apertures in the mounting brackets will become apparent from the following detailed description and drawing (not drawn to scale) in which.

Figure 1:
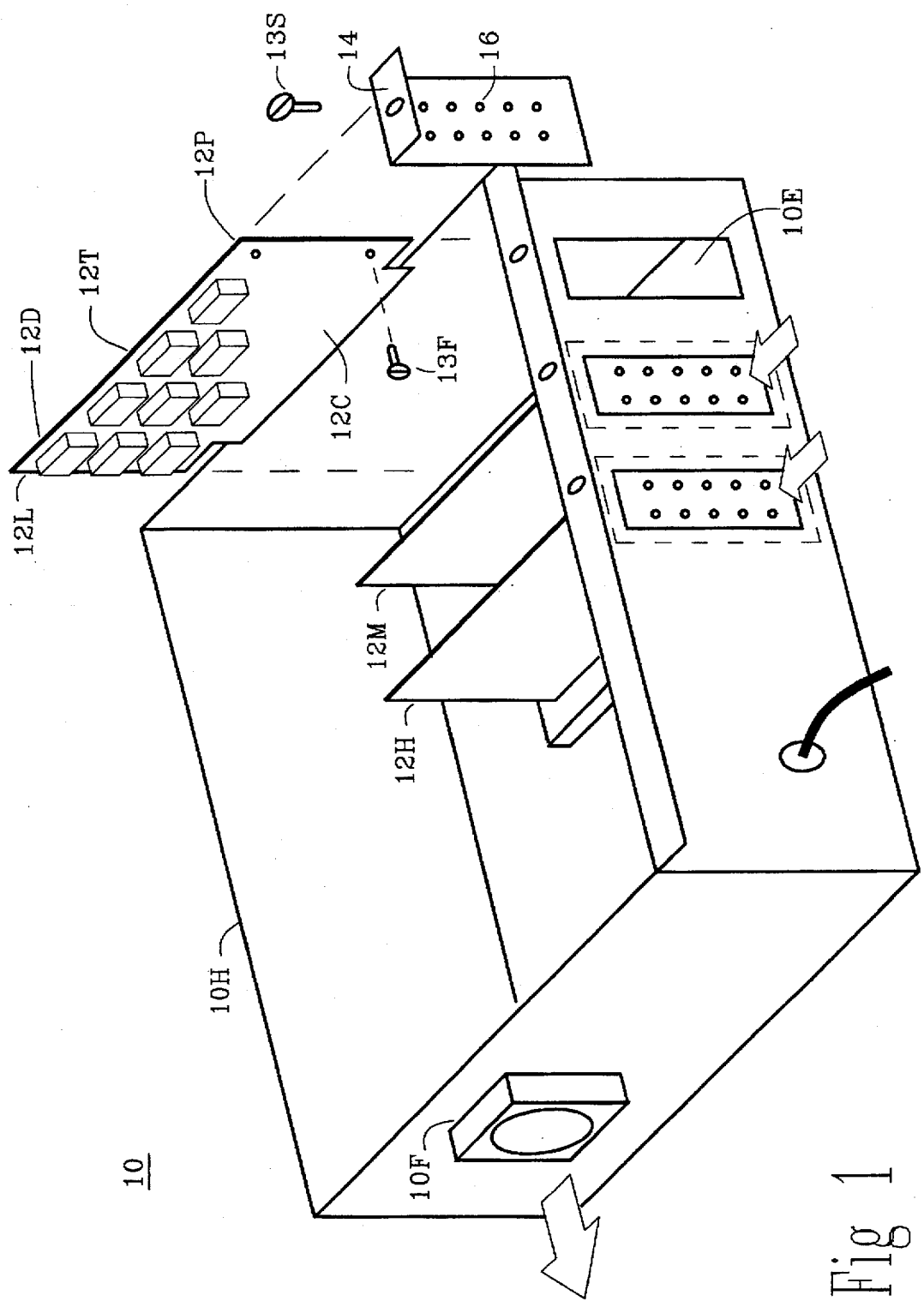
FIG. 1 is an exploded isometric view of the computer apparatus showing the circuit boards and mounting brackets.

The first digit of each reference numeral in the above figures indicates the figure in which that element is most prominently shown. The second digit indicates related structural elements, and a final letter (when used) indicates a sub-portion of an element.

General Embodiment—(FIG. 1)

Computer apparatus 10 has a convective air flow therethrough for removing heat generated by the IC chips on circuit boards 12H, 12M, and 12L and by other computer components within housing 10H. The housing confines the convective air flow, and has elongated I/O openings 10E therethrough for accommodating I/O connections to the circuit boards. The circuit boards are mounted within the housing in adjacent parallel relationship forming air flow channels between the circuit boards. Each circuit board has a housing end 12P proximate the I/O openings in the housing and an interior end 12D distant from the housing. Each channel has a corresponding housing end and interior end. A mounting bracket 14 is fastened to each circuit board at the housing end. The mounting brackets are secured to the housing and cover the I/O openings.

Air vent apertures 16 in the mounting brackets provide air flow communication through the mounting brackets and the I/O openings for directing a portion of the convective air flow through the channel over the adjacent circuit boards. Fan 10F pushes the air flow out of the housing causing cool outside air to be drawn into the housing through each aperture 16.

The circuit boards mounted in computer apparatus 10 do not have identical cooling requirements. High density, high speed boards generate more heat than other boards. The circuit boards have operating temperatures ranging from a highest operating temperature to a lowest operating temperature with intermediate operating temperatures therebetween. The circuit boards with high operating temperatures such as circuit board 12H have high cooling requirements, and may be mounted in a position close to the fan where the convective flow is strongest. The circuit boards with low operating temperatures such as circuit board 12L may be mounted in a position remote from the fan. The circuit boards with intermediate operating temperatures such as circuit board 12M may be mounted in a position intermediate between the close position and the remote position.

Figure 2:
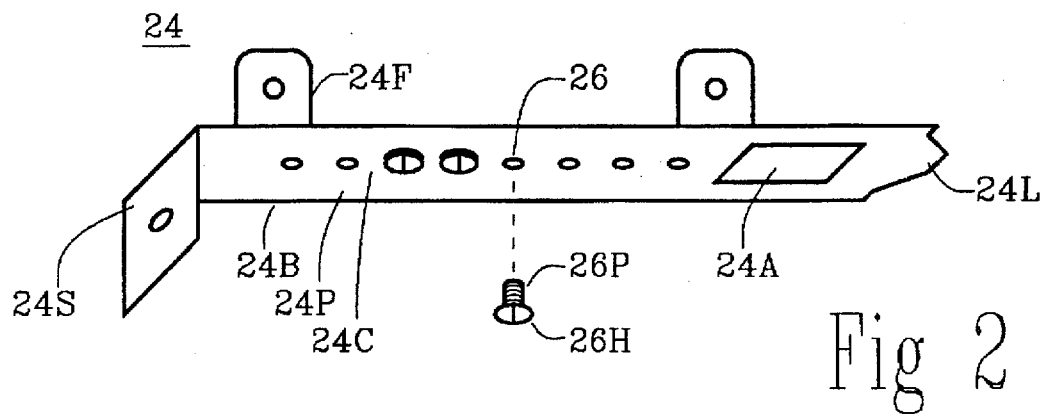
FIG. 2 is an isometric view of a mounting bracket with air vent apertures and a plugging screw.

Mounting Bracket—(FIG. 2)

Mounting bracket 24 secures a circuit board within the computer apparatus. Body 24B of the mounting bracket covers the I/O opening in the computer housing. Lower tab 24L at the bottom of the body engages a cooperating slot in the housing proximate the lower end of the I/O opening. Securing flange 24S at the top of the body extends from the mounting bracket toward the housing for alinement with securing holes along the top of the housing. Securing screws 13S (see FIG. 1) pass through the flange/hole alinement for securing the mounting bracket (and circuit board) to the housing.

A pair of fastening tabs 24F extend from the body of the mounting bracket toward the circuit board for alinement with fastening holes along the housing end of the circuit board. Fastening screws 13F pass through the tab/hole alinement for fastening the circuit board to the mounting bracket. The tabs are along the edge of the mounting bracket, and secure the circuit board in an offset relationship with the mounting bracket. The air vent apertures are on the component side of the circuit board. Each circuit board has a component side 12C for the heat generating components of the circuit board, and a trace side 12T for the conducting traces which electrically connect the components. The component side is exposed to the air vent apertures on the mounting bracket and receive the cooling air flow.

The mounting brackets are larger than the I/O openings causing peripheral portion 24P of the body to overlap and engage the housing around the periphery of the I/O opening. This overlapping engagement minimizes random air leakage into the computer apparatus between the mounting bracket and the housing. Central portion 24C of the body has a plurality of suitable air vents such as round apertures 26 therein for passing cooling air flow. The central portion may have a connector access hole 24A therein for permitting access to I/O connectors on the housing end of the circuit board proximate the mounting bracket.

Suitable aperture plugging devices such as plugging screws 26P may be employed to block some of the air vent apertures within the central portion of the mounting bracket. At least some of the apertures are threaded to engage the threads on the plugging screws. Alternatively, the plugging screws may be self-threading and not require threaded apertures. The plugging screws may be installed into and removed from the apertures on the mounting brackets to alter the number of operating apertures and control the air flow. Rearranging the plugging screws redirects the cooling air volume in the channels throughout the convective air flow system. Installation of plugs into a particular mounting bracket reduces the number of operating apertures, and decreases the volume of air flow through the channel next to that mounting bracket. Removal of plugs increases the number of operating apertures, and increases the volume of air flow. Other plugging materials such as plastic inserts, adhesive putty, or tape 56T (see FIG. 5B) may be employed instead of plugging screws to block the apertures. The plugging material may be applied from the outside and placed over as many apertures as required. Plugging tape 56T is a single piece covering all of the apertures in mounting bracket 54T.

The apertures are readily accessible from the outside of the housing for installation and removal of the plugging screws. The area immediately outside of the housing by the I/O openings offers plenty of working room for fingers and tools. Screw head 26H prevents the plugging screw from passing through the aperture into the housing as the screw is installed. Plugging screws sometimes come lose and slip free of the aperture. These screws will fall to the floor outside of the housing. Lose plugging screws cannot fall into the housing causing electric shorts and other problems.

Figure 3:
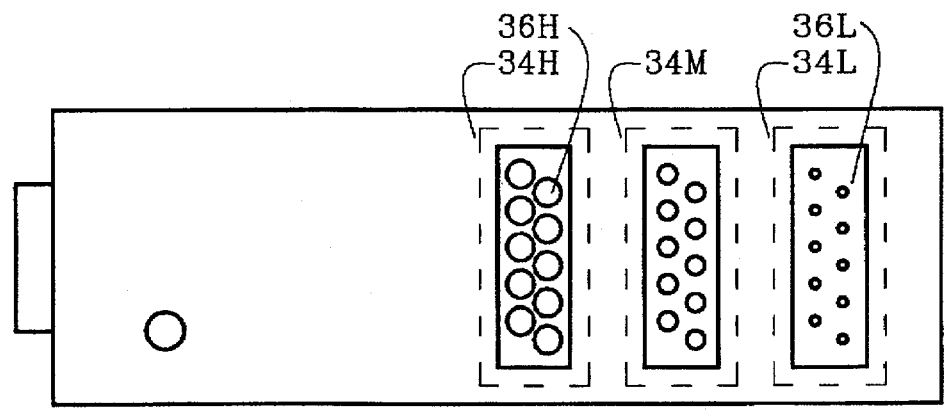
FIG. 3 is an elevational view of the back of a computer apparatus showing mounting bracket apertures of different sizes.
Figure 4:
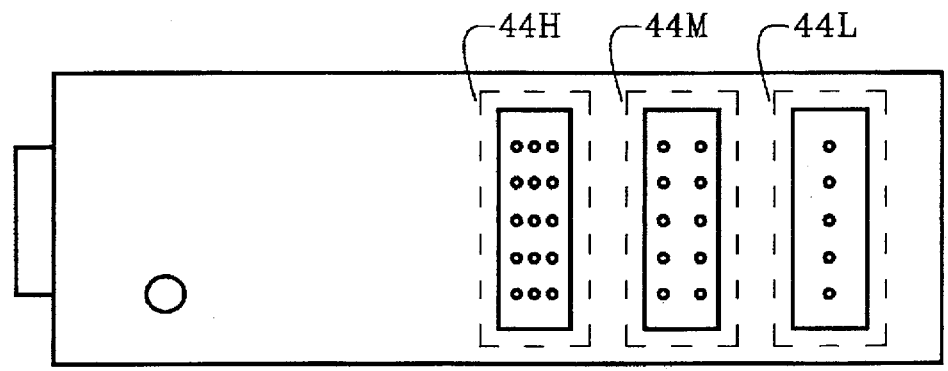
FIG. 4 is an elevational view of the back of a computer apparatus showing mounting bracket apertures of different concentrations.

Air Flow Volume (FIGS. 3 and 4)

The volume of convective air flow through each individual channel is affected by the size and number of air vent apertures on the mounting bracket at the housing end of that channel. The volume is proportional to the total area of all of the apertures (adjusted for edge drag effects). A circuit board with a high operating temperature is preferably provided with a high volume of cooling air flow in the adjacent channel. A circuit board with a low operating temperature is preferably provided with a low volume of cooling air flow. Circuit boards with intermediate operating temperatures are preferably provided with an intermediate volume between the high volume and the low volume.

The fan, channels, and apertures establish an air flow system in which the air flow volume through each channel is dependent on the volume in the other channels. As the flow in one channel is increased, the total flow in the remaining channels of the system must decrease. The mounting brackets are removably secured to the circuit boards by securing screws 13S to permit exchanging any mounting bracket for another mounting bracket which supports a more suitable volume of cooling air flow. Thus the entire convective flow may be redirected to suit the circuit board cooling requirements by relocating some (or all) of the mounting brackets.

Aperture Size (FIG. 3)

A circuit board with a high operating temperature may be fastened to mounting bracket 34H which has large diameter air vent apertures 36H (as shown in FIG. 3) to permit a high volume of cooling air flow to pass by the high operating temperature circuit board. These large diameter apertures preferably have a maximum bore diameter of about 5–6 mm. The I/O openings are typically about 9 cm high by about 10 mm wide. The 5 mm apertures may be arranged in two staggered columns of about nine apertures each. Larger diameters may cause excessive rf leakage, and tend to weaken the metal forming the mounting brackets. For additional cooling effect, these high operating temperature circuit boards may be mounted in a position close to the fan.

A circuit board with a low operating temperature may be fastened to mounting bracket 34L which has small apertures 36L to permit a low flow volume. These small diameter apertures preferably have a minimum bore diameter of about 2 mm. The 2 mm apertures may be arranged in three staggered columns of about 16 apertures each. Due to edge drag at the periphery of the aperture, the effective diameter is less than 2 mm. Smaller diameters may cause excessive drag on the passing air flow. These low operating temperature circuit boards have low cooling requirements and therefore may be mounted in a position remote from the fan.

A circuit board with an intermediate operating temperature may be fastened to mounting bracket 34M which has intermediate size apertures to permit an intermediate flow volume. These intermediate apertures may be any size from about 2 mm up to about 6 mm.

Aperture Concentration (FIG. 4)

Alternatively, high operating temperature circuit boards may be fastened to mounting bracket 44H (see FIG. 4)

which has a high concentration of air vent apertures to permit a high volume of cooling air flow to pass therethrough. Low operating temperature circuit boards may be fastened to mounting bracket 44L which has fewer apertures to permit a low volume of cooling air. The high operating temperature circuit boards may be mounted close to the fan, and the low operating temperature circuit boards may be are mounted remote from the fan. Intermediate operating temperature circuit boards may be fastened to mounting bracket 44M which has an intermediate concentration of apertures to permit an intermediate flow volume.

Figure 5A:
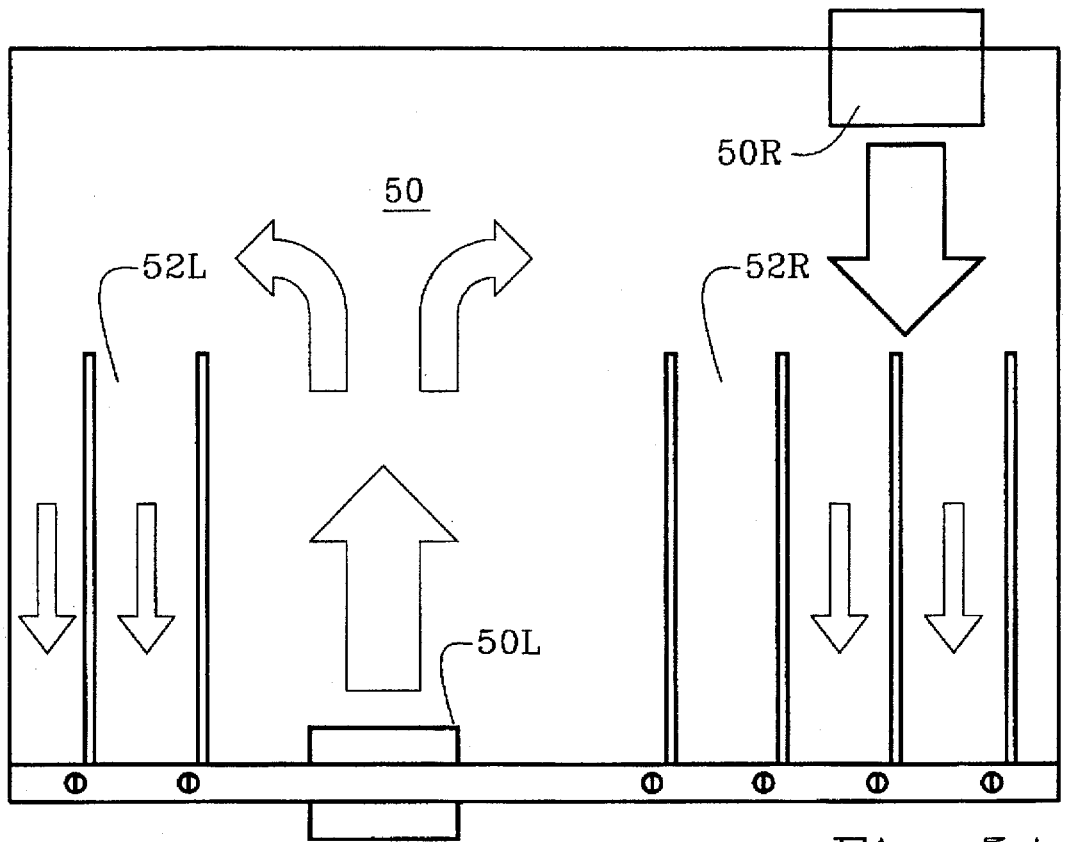
FIG. 5A is a plan view of another computer apparatus with a complex air flow system.
Figure 5B:
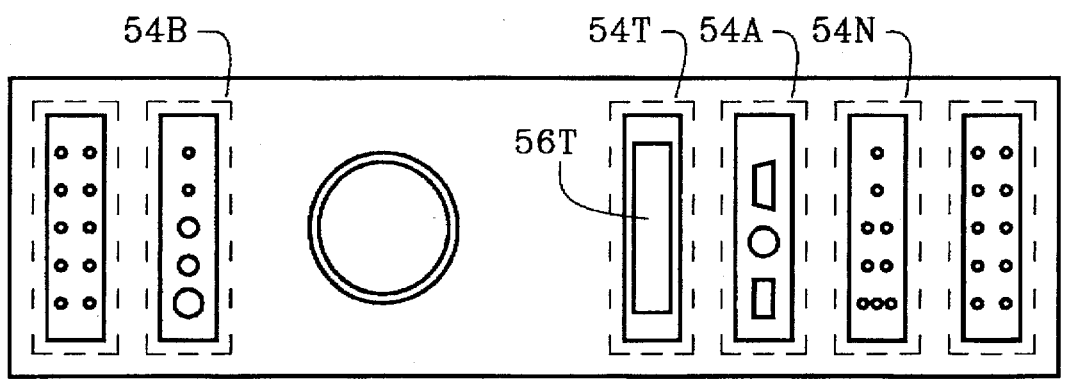
FIG. 5B is an elevational view of the back of the computer apparatus of FIG. 5A.

Complex Flow Embodiment (FIG. 5A and 5B)

The plurality of the circuit boards within computer apparatus 50 may be mounted in a plurality of groups of circuit boards such as the left group 52L and right group 52R (shown in FIG. 5A). The circuit boards in each group are arranged in adjacent parallel relationship, forming of air flow channels between adjacent pairs of circuit boards. The channels establish a plurality of air flow systems having an interdependent air flow volume within each channel of each system. A fan device moves the air flow into and out of the housing and for circulating the convective air flow throughout the housing. The fan device may be a single fan such as exhaust fan 10F shown in FIG. 1 which pushes cooling air out of the housing from the inside, and causing the apertures to pass cooling air into the housing from the outside. Alternatively, the fan device may be a plurality of fans such as intake fans 50L and 50R. These intake fans pull cooling air into the housing from the outside, and the air vent apertures pass the cooling air out of the housing.

The apertures may be uniformly distributed across the mounting bracket as shown in FIG. 1. Alternatively, mounting bracket 54N has apertures non-uniformly distributed with more apertures near the bottom of the mounting bracket proximate the housing. The bottom of the channels tend to become stagnant with still hot air, and may need more convective air flow to carry the heat away. Mounting bracket 54B shows larger apertures near the bottom and smaller apertures near the top for increasing the bottom flow in the channel. Mounting bracket 54A has several connector access holes and no apertures.

CONCLUSION

It will be apparent to those skilled in the art that the objects of this invention have been achieved as described hereinbefore. Clearly various changes may be made in the structure and embodiments shown herein without departing from the concept of the invention. Further, features of the embodiments shown in the various figures may be employed with the embodiments of the other figures. Therefore, the scope of the invention is to be determined by the terminology of the following claims and the legal equivalents thereof.

I claim as my invention:

1. Computer apparatus with convective cooling air flow therethrough, comprising:

housing for confining the convective air flow, and having elongated I/O openings therethrough;

fan means for moving the air flow into and out of the housing and for circulating the convective air flow throughout the housing;

a plurality of circuit boards mounted within the housing each having a housing end proximate the I/O openings in the housing and an interior end distant from the housing;

mounting brackets secured to the housing over the I/O openings, and fastened to the circuit boards at the housing end thereof for securing the circuit boards to the housing; and air vent apertures in the mounting brackets to provide air flow communication through the mounting brackets and the I/O openings for directing a portion of the cooling air flow over each of the circuit boards.

2. The computer apparatus of claim 1, wherein two of the circuit boards are mounted in an adjacent parallel relationship forming an air flow channel therebetween, each channel having a housing end and an interior end with the air vent apertures in the mounting brackets at the housing end directing cooling air flow through the channel over the two circuit boards.

3. The computer apparatus of claim 1, wherein the plurality of the circuit boards are mounted in an adjacent parallel relationship forming air flow channels therebetween, each channel having a housing end and an interior end with the air vent apertures in the mounting brackets at the housing end directing a portion of the cooling air flow through the channel over the adjacent circuit boards, the channels establishing an air flow system having an interdependent air flow volume through each channel.

4. The computer apparatus of claim 3, wherein the circuit boards have operating temperatures ranging from a highest operating temperature to a lowest operating temperature with intermediate operating temperatures therebetween.

5. The computer apparatus of claim 4, wherein circuit boards with high operating temperatures are mounted in a position close to the fan means, circuit boards with low operating temperatures are mounted in a position remote from the fan means, and circuit boards with intermediate operating temperatures are mounted in a position intermediate between the close position and the remote position.

6. The computer apparatus of claim 4, wherein:

circuit boards with high operating temperatures have a high volume of cooling air flow in the adjacent channels formed thereby;

circuit boards with low operating temperatures have a low volume of cooling air flow in the adjacent channels formed thereby; and circuit boards with intermediate operating temperatures have an intermediate volume of cooling air flow between the high volume and the low volume in the adjacent channels formed thereby.

7. The computer apparatus of claim 6, wherein the mounting brackets are removable secured to the circuit boards to permit exchanging for a mounting bracket with a more suitable volume of cooling air flow.

8. The computer apparatus of claim 6, wherein each circuit board has a component side for the heat generating components of the circuit board, and a trace side for the conducting traces between the components, and the mounting bracket is secured offset to the circuit board with the air vent apertures on the component side thereof.

9. The computer apparatus of claim 6, wherein circuit boards with high operating temperatures have large air vent apertures in their mounting brackets to permit a high volume of cooling air flow to pass, and circuit boards with low operating temperatures have small air vent apertures in their mounting brackets to permit a low volume of cooling air flow to pass.

10. The computer apparatus of claim 9, wherein the circuit boards with high operating temperatures and large air vent apertures are mounted in a position close to the fan means, and the circuit boards with low operating temperatures and small air vent apertures are mounted in a position remote from the fan means.

11. The computer apparatus of claim 6, wherein circuit boards with high operating temperatures have more air vent apertures in their mounting brackets to permit a high volume of cooling air flow to pass, and circuit boards with low operating temperatures have fewer air vent apertures in their mounting brackets to permit a low volume of cooling air flow to pass.

12. The computer apparatus of claim 11, wherein the circuit boards with high operating temperatures and more air vent apertures are mounted in a position close to the fan means, and the circuit boards with low operating temperatures and fewer air vent apertures are mounted in a position remote from the fan means.

13. The computer apparatus of claim 7, further comprising aperture plug means for blocking the air vent apertures on the mounting brackets to reduce the number of operating air vent apertures in order to control the interdependent air flow volumes through the channels establishing the air flow system.

14. The computer apparatus of claim 1, wherein the plurality of the circuit boards are mounted in a plurality of groups of circuit boards having an adjacent parallel relationship within each group forming of air flow channels therebetween, each channel having a housing end and an interior end with the air vent apertures in the mounting brackets at the housing end for directing a portion of the cooling air flow through the channel over the adjacent circuit boards, the channels establishing a plurality of air flow systems having an interdependent air flow volume within each channel of each system.

15. The computer apparatus of claim 1, wherein the mounting brackets are larger than the I/O openings and engage the housing around the periphery of the I/O opening.

16. The computer apparatus of claim 1, wherein the fan means is a single fan.

17. The computer apparatus of claim 1, wherein the fan means is a plurality of fans.

18. The computer apparatus of claim 1, wherein the fan means pulls cooling air into the housing from the outside, and the air vent apertures pass cooling air out of the housing from the inside.

19. The computer apparatus of claim 1, wherein the fan means pushes cooling air out of the housing from the inside, and the air vent apertures pass cooling air into the housing from the outside.

20. A circuit board mounting bracket for securing a circuit board within a computer housing proximate an elongated I/O opening therein, and for directing the passage of a cooling air flow comprising:

an elongated body for securing a single circuit board within the computer housing, and for covering the elongated I/O opening in the computer housing;

the body having a tab at one end thereof for engaging the housing proximate one end of the elongated I/O opening;

the body having a flange at the other one end thereof for engaging the housing proximate the other end of the elongated I/O opening;

the body having a peripheral portion for overlapping the housing around the periphery of the elongated I/O opening; and the body having a central portion with a plurality of air vent apertures therein for directing the passage of the cooling air flow therethrough over the single circuit board proximate the body.

21. The mounting bracket of claim 20, further comprising a plurality of aperture plugs for blocking at least some of the air vent apertures within the central portion of the mounting bracket.

22. The mounting bracket of claim 20, wherein the plurality of aperture plugs may be installed into and removed from the air vent apertures to control the volume of cooling air flow therethrough.

23. The mounting bracket of claim 22, wherein the plurality of aperture plugs are accessible from the outside of the housing for installation and removal.

24. The mounting bracket of claim 21, wherein the plurality of aperture plugs are a plurality of plugging screws, and wherein at least some of the air vent apertures are threaded to receive one of the plugging screws.

25. The mounting bracket of claim 21, wherein the plurality of aperture plugs are a plurality of self-threading plugging screws.

26. The mounting bracket of claim 20, wherein the air vent apertures are round.

27. The mounting bracket of claim 20, wherein the air vent apertures are uniformly distributed across the mounting bracket.

28. The mounting bracket of claim 20, wherein the air vent apertures are non-uniformly distributed across the mounting bracket with more air vent apertures near the bottom of the mounting bracket proximate the housing.

29. The mounting bracket of claim 20, wherein the mounting bracket has at least one connector access hole therein for permitting access to I/O connectors on the circuit board proximate the mounting bracket.

* * * * *